United States Patent
Yilmaz

(10) Patent No.: US 9,647,658 B2
(45) Date of Patent: May 9, 2017

(54) RESISTIVE INTERPOLATION FOR A TOUCH SENSOR WITH OPAQUE CONDUCTIVE MATERIAL

(71) Applicant: Esat Yilmaz, Santa Cruz, CA (US)

(72) Inventor: Esat Yilmaz, Santa Cruz, CA (US)

(73) Assignee: Atmel Corporation, San Jose, CA (US)

( * ) Notice: Subject to any disclaimer, the term of this patent is extended or adjusted under 35 U.S.C. 154(b) by 1115 days.

(21) Appl. No.: 13/671,106

(22) Filed: Nov. 7, 2012

(65) Prior Publication Data

US 2014/0125403 A1 May 8, 2014

(51) Int. Cl.
*G08B 19/00* (2006.01)
*H03K 17/96* (2006.01)
*G06F 3/044* (2006.01)

(52) U.S. Cl.
CPC ......... *H03K 17/9622* (2013.01); *G06F 3/044* (2013.01)

(58) Field of Classification Search
USPC .......................................... 307/652; 327/517
See application file for complete search history.

(56) References Cited

U.S. PATENT DOCUMENTS

| | | | |
|---|---|---|---|
| 7,663,607 B2 | 2/2010 | Hotelling | |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |
| 2006/0132462 A1* | 6/2006 | Geaghan | G06F 3/044 345/173 |
| 2009/0315854 A1 | 12/2009 | Matsuo | |
| 2010/0044122 A1* | 2/2010 | Sleeman | G01D 5/2405 178/18.06 |
| 2010/0045632 A1* | 2/2010 | Yilmaz | G01D 5/2405 345/174 |
| 2011/0025639 A1 | 2/2011 | Trend | |
| 2011/0095996 A1 | 4/2011 | Yilmaz | |
| 2011/0279400 A1 | 11/2011 | Yilmaz | |
| 2012/0139829 A1* | 6/2012 | Anno | G06F 3/041 345/156 |
| 2012/0242588 A1 | 9/2012 | Myers | |
| 2012/0242592 A1 | 9/2012 | Rothkopf | |

(Continued)

FOREIGN PATENT DOCUMENTS

WO   WO 2012/129247   9/2012

OTHER PUBLICATIONS

U.S. Appl. No. 61/454,936, filed Mar. 21, 2011, Myers.
U.S. Appl. No. 61/454,950, filed Mar. 21, 2011, Lynch.
U.S. Appl. No. 61/454,894, filed Mar. 21, 2011, Rothkopf.

*Primary Examiner* — Hal Kaplan
*Assistant Examiner* — Xuan Ly
(74) *Attorney, Agent, or Firm* — Baker Botts L.L.P.

(57) ABSTRACT

In one embodiment, an apparatus comprises a substrate. The apparatus further comprises a plurality of drive electrodes disposed on the substrate. Each of the plurality of drive electrodes is formed of an opaque conductive material. The apparatus further comprises a plurality of resistors. For each adjacent pair of drive electrodes of the plurality of drive electrodes, a resistor of the plurality of resistors is coupled between the pair of drive electrodes.

19 Claims, 4 Drawing Sheets

(56) References Cited

U.S. PATENT DOCUMENTS

| | | |
|---|---|---|
| 2012/0243151 A1 | 9/2012 | Lynch |
| 2012/0243719 A1 | 9/2012 | Franklin |
| 2013/0076612 A1 | 3/2013 | Myers |
| 2014/0001023 A1* | 1/2014 | Guard .................... G06F 3/044 200/600 |

* cited by examiner

RESISTIVE INTERPOLATION FOR A TOUCH SENSOR WITH OPAQUE CONDUCTIVE MATERIAL

TECHNICAL FIELD

This disclosure relates generally to touch sensors.

BACKGROUND

A touch sensor may detect the presence and location of a touch or the proximity of an object (such as a user's finger or a stylus) within a touch-sensitive area of the touch sensor overlaid on a display screen, for example. In a touch-sensitive-display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch sensors, such as (for example) resistive touch screens, surface acoustic wave touch screens, and capacitive touch screens. Herein, reference to a touch sensor may encompass a touch screen, and vice versa, where appropriate. When an object touches or comes within proximity of the surface of the capacitive touch screen, a change in capacitance may occur within the touch screen at the location of the touch or proximity. A touch-sensor controller may process the change in capacitance to determine its position on the touch screen.

DESCRIPTION OF EXAMPLE EMBODIMENTS

Figure 1:
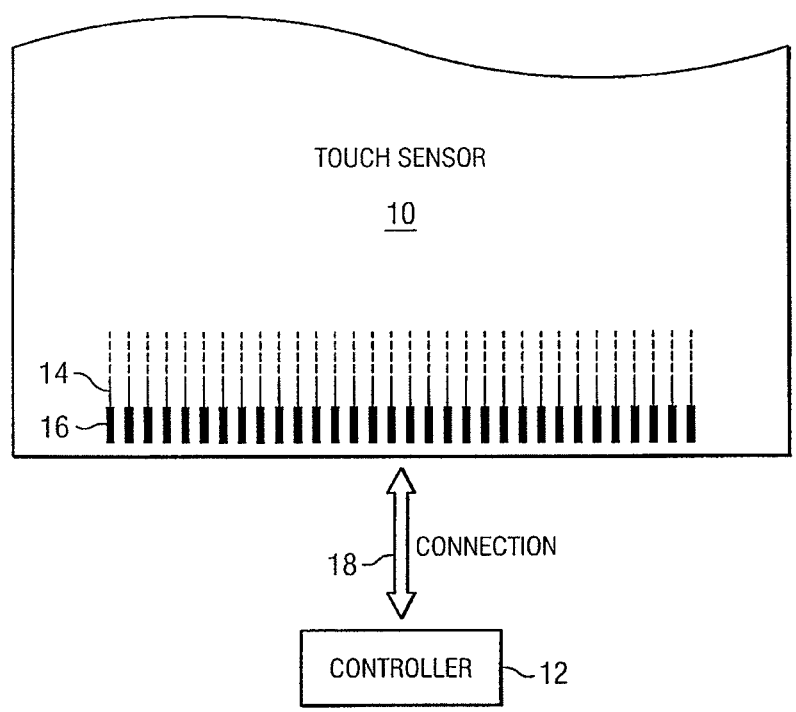
FIG. 1 illustrates an example touch sensor with an example touch-sensor controller.

FIG. 1 illustrates an example touch sensor 10 with an example touch-sensor controller 12. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 10 may include one or more touch-sensitive areas, where appropriate. Touch sensor 10 may include an array of drive and sense electrodes (or an array of electrodes of a single type) disposed on one or more substrates, which may be made of a dielectric material. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a ground electrode, a guard electrode, a drive electrode, or a sense electrode) may be an area of conductive material forming a shape, such as for example a disc, square, rectangle, thin line, other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of a transparent material such as indium tin oxide (ITO) and the ITO of the electrode may occupy approximately 100% of the area of its shape (sometimes referred to as 100% fill), where appropriate. In particular embodiments, the conductive material of an electrode may occupy substantially less than 100% of the area of its shape. As an example and not by way of limitation, an electrode may be made of one or more opaque materials such as fine lines of metal or other conductive material (FLM), such as for example copper, silver, or a copper- or silver-based material, and the fine lines of conductive material may occupy approximately 5% of the area of its shape in a hatched, mesh, or other suitable pattern. Herein, reference to FLM encompasses such material, where appropriate. Although this disclosure describes or illustrates particular electrodes made of particular conductive material forming particular shapes with particular fill percentages having particular patterns, this disclosure contemplates any suitable electrodes made of any suitable conductive material forming any suitable shapes with any suitable fill percentages having any suitable patterns.

Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA may be disposed between the cover panel and the substrate with the conductive material forming the drive or sense electrodes. The mechanical stack may also include a second layer of OCA and a dielectric layer (which may be made of PET or another suitable material, similar to the substrate with the conductive material forming the drive or sense electrodes). As an alternative, where appropriate, a thin coating of a dielectric material may be applied instead of the second layer of OCA and the dielectric layer. The second layer of OCA may be disposed between the substrate with the conductive material making up the drive or sense electrodes and the dielectric layer, and the dielectric layer may be disposed between the second layer of OCA and an air gap to a display of a device including touch sensor 10 and touch-sensor controller 12. As an example only and not by way of limitation, the cover panel may have a thickness of approximately 1 mm; the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

One or more portions of the substrate of touch sensor 10 may be made of polyethylene terephthalate (PET) or another suitable material. This disclosure contemplates any suitable substrate with any suitable portions made of any suitable material. In particular embodiments, the drive or sense electrodes in touch sensor 10 may be made of ITO in whole or in part. In particular embodiments, the drive or sense electrodes in touch sensor 10 may be made of fine lines of metal or other conductive material. As an example and not by way of limitation, one or more portions of the conductive material may be copper or copper-based and have a thickness of approximately 5 μm or less and a width of approximately 10 μm or less. As another example, one or more portions of the conductive material may be silver or silver-based and similarly have a thickness of approximately 5 μm or less and a width of approximately 10 μm or less. This disclosure contemplates any suitable electrodes made of any suitable material.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of electrodes of a single type that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such one or more central processing units (CPUs)) of a device that includes touch sensor 10 and touch-sensor controller 12, which may respond to the touch or proximity input by initiating a function of the device (or an application running on the device). Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs), such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to the substrate of touch sensor 10, as described below. The FPC may be active or passive, where appropriate. In particular embodiments, multiple touch-sensor controllers 12 are disposed on the FPC. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 14 of conductive material disposed on the substrate of touch sensor 10 may couple the drive or sense electrodes of touch sensor 10 to connection pads 16, also disposed on the substrate of touch sensor 10. As described below, connection pads 16 facilitate coupling of tracks 14 to touch-sensor controller 12. Tracks 14 may extend into or around (e.g. at the edges of) the touch-sensitive area(s) of touch sensor 10. Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 100 μm or less. As another example, the conductive material of tracks 14 may be silver or silver-based and have a width of approximately 100 μm or less. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground lines terminating at a ground connector (which may be a connection pad 16) at an edge of the substrate of touch sensor 10 (similar to tracks 14).

Connection pads 16 may be located along one or more edges of the substrate, outside the touch-sensitive area(s) of touch sensor 10. As described above, touch-sensor controller 12 may be on an FPC. Connection pads 16 may be made of the same material as tracks 14 and may be bonded to the FPC using an anisotropic conductive film (ACF). Connection 18 may include conductive lines on the FPC coupling touch-sensor controller 12 to connection pads 16, in turn coupling touch-sensor controller 12 to tracks 14 and to the drive or sense electrodes of touch sensor 10. In another embodiment, connection pads 16 may be connected to an electro-mechanical connector (such as a zero insertion force wire-to-board connector); in this embodiment, connection 18 may not need to include an FPC. This disclosure contemplates any suitable connection 18 between touch-sensor controller 12 and touch sensor 10.

Figure 2:
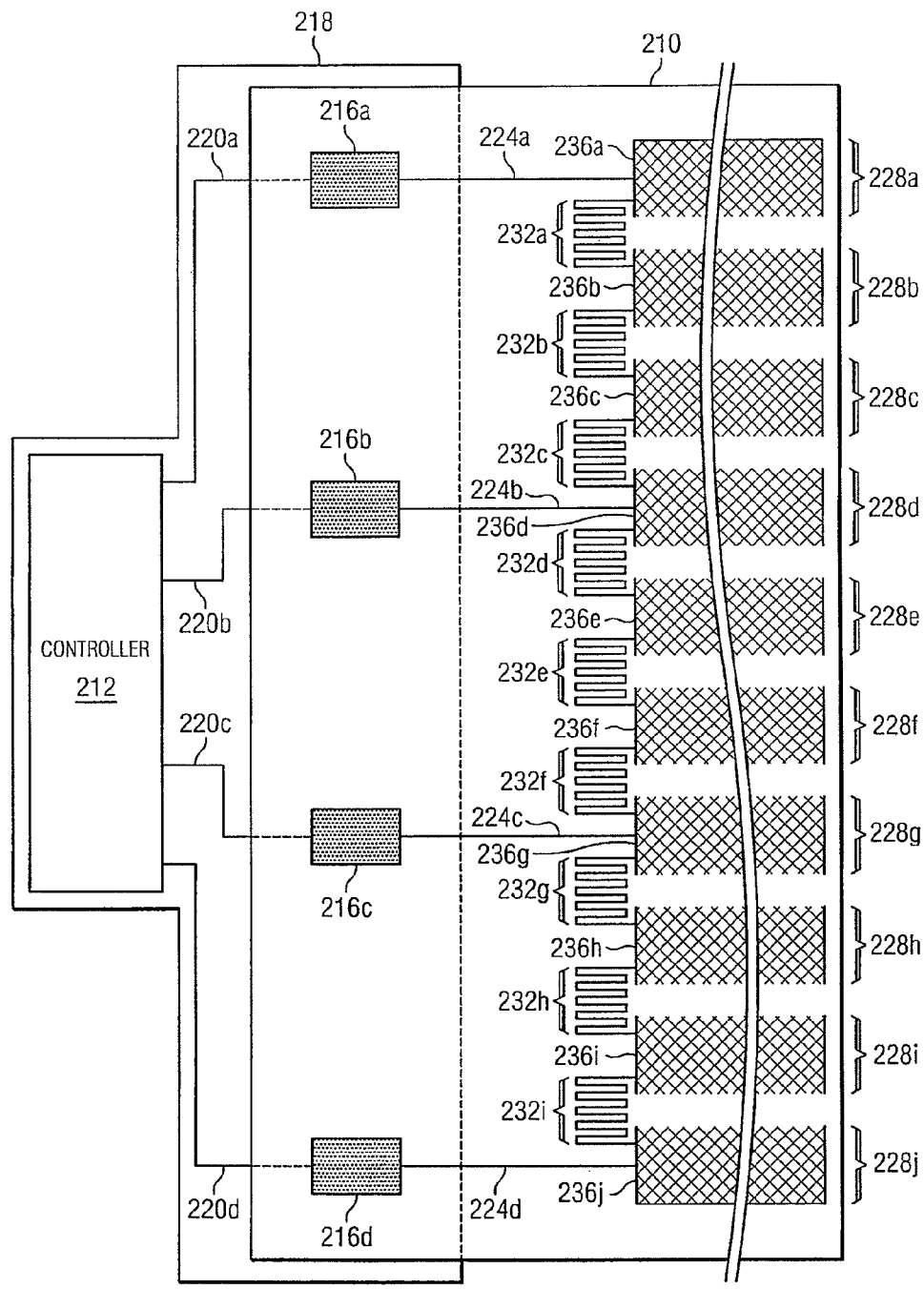
FIG. 2 illustrates an example touch sensor comprising drive electrodes formed of opaque conductive material and configured for resistive interpolation using resistors adjacent the drive electrodes.

FIG. 2 illustrates an example touch sensor 210 comprising drive electrodes 228 formed of opaque conductive material and configured for resistive interpolation using resistors 232 adjacent the drive electrodes. The drive electrodes 228 of touch sensor 210 are coupled to controller 212 via connection pads 216, tracks 224, and connector 218. Touch sensor 210, controller 212, connection pads 216, tracks 224, and connector 218 may have any suitable characteristics described above with respect to touch sensor 10, touch-sensor controller 12, connection pads 16, tracks 14, and connector 18 respectively.

In operation, controller 212 may supply drive signals to drive electrodes 228. The drive signals received at various drive electrodes 228 may have different voltage levels due to resistive interpolation effects implemented by resistors 232 that will be explained in further detail below. Controller 212 may take the various different voltage levels into account when determining where a touch has occurred. The resistive interpolation scheme shown in FIG. 2 may increase the number of drive electrodes 228 that may be driven by a single pin of controller 212, thus reducing the amount of pins required to drive a fixed amount of drive electrodes 228 or increasing the amount of drive electrodes 228 that may be driven by a fixed amount of pins. The resistive interpolation scheme shown in FIG. 2 may also reduce the number of tracks 224 that couple connection pads 216 to drive electrodes 228. In particular embodiments, resistors 232 and drive electrodes 228 are made of the same opaque conductive material, thus simplifying the manufacturing process as compared to an implementation that utilizes discrete resistors.

Touch sensor 210 includes a plurality of drive electrodes 228 that may extend in any suitable direction. For example, in the embodiment depicted, drive electrodes 228 each extend in a horizontal direction. Drive electrodes 228 may have any suitable characteristics of the drive electrodes described above in connection with FIG. 1. Each drive electrode, alone or in combination with a sense electrode, may form a capacitive node at which a touch may be detected. Drive electrodes 228 may be formed of any suitable material, such as FLM or other opaque conductive material.

As depicted, drive electrodes 228 may be formed with a mesh pattern. The mesh pattern includes various segments of an opaque conductor coupled together around areas that do not include the opaque conductor. In particular embodiments, the segments of conductive material used to form the mesh occupy substantially less than 100% (such as for example, substantially less than 5%) of the area of its shape. In particular embodiments, one or more edges 236 of the drive electrodes may include a strip of the opaque conductive material that is electrically connected to the mesh pattern. That is, an edge 236 may form a perimeter around all or a portion of the mesh pattern. An edge 236 may facilitate coupling of the mesh portion of a drive electrode 228 to other touch screen elements, such as tracks 224 or resistors 236. In particular embodiments, drive electrodes 228 may be formed with a hatched pattern that includes a plurality of lines of opaque conductive material spaced apart from each other and electrically coupled by one or more edges of a drive electrode 228.

In a particular embodiment, when the drive electrodes 228 are formed, the opaque conductive material is disposed on a substrate in a mesh pattern and channels between the drive electrodes 228 are formed. For example, channels may be formed by removing portions of the mesh pattern by laser ablation, etching, cutting, or other suitable method, such that the drive electrodes 228 are electrically isolated from each other or from other touch sensor elements (such as a sense electrode) by the channels. In other embodiments, the channels are included in a pattern of material that is printed, deposited, or otherwise placed on the substrate to form drive electrodes 228. Accordingly, the channels are created when the material forming the drive electrodes 228 is placed on the substrate and do not require an additional step for formation. In particular embodiments, only portions of drive electrodes 228 are electrically isolated from each other since the drive electrodes 228 may be coupled to each other at edges 236 via resistors 232 (or other touch screen elements) as shown. The channels between drive electrodes 228 may have any suitable dimensions. For example, in particular embodiments, the channels between the drive electrodes 228 may be narrower than depicted in FIG. 2.

One or more of the drive electrodes 228 may be driven by a pin of controller 212. That is, controller 212 may send drive signals to one or more drive electrodes 228 through a pin of the controller. In the embodiment depicted, connector 218 couples controller 212 to the connection pads 216 of touch sensor 210, which are in turn coupled to drive electrodes via tracks 224. In a particular embodiment, connector 218 includes an FPC. Pins of controller 212 may be coupled to connector 218 in any suitable manner. For example, the pins may be soldered or bonded to connector 218. In other embodiments, controller 212 is not located on connector 218. For example, controller 212 may be placed on a printed circuit board. Traces on the printed circuit board may coupled the pins of controller 212 to a location where the connector 218 interfaces with the printed circuit board. A conductive line 220 of connector 218 may run from the point of connection to a pin of controller 212 (or trace of a PCB that is connected to the pin) to a conductive area (e.g., a connection pad) of connector 218 that is configured to interface with a connection pad 216 of touch sensor 210. When connection pads 216 are coupled to corresponding points on connector 218, signals from pins of controller 212 may travel through conductive lines 220, connection pads 216, and tracks 224 to drive electrodes 228. For example, a drive signal from a particular pin of controller 212 may travel through conductive line 220a, connection pad 216a, and track 224a to drive electrode 228a.

In particular embodiments, resistive interpolation between drive electrodes may be implemented by coupling one or more resistors 232 between drive electrodes 228. In the embodiment depicted, each pair of adjacent drive electrodes 228 includes a resistor 232 coupled between the drive electrodes of the pair. For example, resistor 232a is coupled between drive electrode 228a and drive electrode 228b, resistor 232b is coupled between drive electrode 228b and drive electrode 228c, and so on. In the embodiment depicted, the resistors 232 are directly connected to the drive electrodes 228. That is, there are no intervening touch screen elements such as tracks 224. In particular embodiments, resistors 232 are coupled to edges 236 of drive electrodes 228.

In a particular embodiment, resistors 232 and drive electrodes 228 are formed of the same material. For example, resistors 232 and drive electrodes 228 may both be formed of FLM or other opaque conductive material. The material of resistors 232 may be arranged in a flood pattern (e.g., the opaque conductive material may occupy 100% of the area of the shape of the resistor), mesh pattern, hatched pattern, or other suitable pattern. In particular embodiments, fine lines of conductive material used to form resistors 232 occupy substantially less than 100% (such as for example, substantially less than 5%) of the area of its shape in a mesh, hatched, or other suitable pattern.

Resistors 232 may be formed using the intrinsic resistance of the opaque conductive material. For example, a resistor 232 may be formed of a "meandered" pattern, wherein the resistance of resistor 232 is created by the windings of resistor 232. In this manner, as electrical current flows through the opaque conductive material of resistor 232, the electrical current meets a certain resistance as it travels through the meandering pattern. An example of a meandered pattern is the repeating rectangular pattern of resistors 232 shown in FIG. 2. Other suitable meandering patterns may be used. For example, the meandering pattern may include one or more curved lines or may be asymmetrical. Resistors 232 may have any suitable geometry or dimensions. As an example and not by way of limitation, resistor 232 may have a width of 1 millimeter (mm) and repeating vertical rectangular sections with heights of 0.1 mm each. In a particular embodiment, resistor 232 may be formed of material placed in a generally sinusoidal pattern.

Resistors 232 may have any suitable resistance. As an example, a resistor 232 may have a resistance between 500 ohms and 100,000 ohms. In a particular embodiment, resistors 232 each have the same resistance or substantially the same resistance (e.g., each resistance value may be within 5 percent of each other resistance value). Lower values of resistance require more current (and hence energy) to drive from controller 212 but allow faster capacitive measurements since they result in lower time constants and hence can be charged and discharged faster. Higher values require less current (and hence energy) to drive but result in higher time constants and hence must be charged and discharged more slowly.

Resistors 232 may allow resistive interpolation to be used during measurements of touch sensor 10. For purposes of explanation, the drive electrodes that are coupled directly to a pin of controller 212 (rather than coupled to a pin through one or more other drive electrodes 228 and one or more resistors 232) will be referred to herein as "primary drive electrodes" and the other drive electrodes will be referred to as "secondary drive electrodes." Thus, in the embodiment depicted, primary drive electrodes include drive electrodes 228a, 228d, 228g, and 228j and secondary drive electrodes include drive electrodes 228*b*, 228*c*, 228*e*, 228*f*, 228*h*, and 228*i*. Resistors 232 implement one or more voltage dividers, such that the amplitude of a drive signal sent to a primary drive electrode is progressively attenuated between the primary drive electrode and an adjacent primary drive electrode.

In a particular embodiment, controller 212 transmits a drive signal to a primary drive electrode while pulling all other primary drive electrodes to ground. Any suitable drive signal may be used, such as a drive signal comprising electrical pulses, sine waves, or other signals. By way of example, a drive signal comprising electrical pulses with a peak-to-peak voltage of 1 V may be transmitted to drive electrode 228*a* while drive electrodes 228*d*, 228*g*, and 228*j* are pulled to ground by controller 212. Assuming that resistors 232*a-c* each have the same resistance, drive electrode 228*a* will be driven with a drive signal having a peak-to-peak voltage of 1 V, drive electrode 228*b* will be driven with a drive signal having a peak-to-peak voltage of 0.66666 V, and drive electrode 228*c* will be driven with a drive signal having a peak-to-peak voltage of 0.33333 V. As another example, when drive electrode 228*d* is driven with a 1 V peak-to-peak signal and the other primary drive electrodes are pulled to ground, drive electrodes 228*c* and 228*e* are driven with a 0.66666 V peak-to-peak signal, and drive electrodes 228*b* and 228*f* are driven with a 0.33333 V peak-to-peak signal. During measurement of the various capacitive nodes, the various voltage levels of the drive signals at the drive electrodes 228 are taken into account by controller 212 and/or other circuitry or software that facilitates touch detection.

The resistive interpolation scheme shown in FIG. 2 allows controller 212 to drive multiple drive electrodes 228 with a single pin, thus reducing the amount of pins (and drive circuitry) of controller 212. Such embodiments may also allow a controller 212 with a given number of pins to control a touch sensor with a larger area than would be possible with using resistive interpolation. Forming resistors 232 of the same material as drive electrodes 228 may simplify and/or reduce costs during manufacture of touch sensor 210.

Although a particular arrangement is shown in FIG. 2, any suitable resistive interpolation arrangement may be used. For example, any suitable number of resistors 232 may be placed between adjacent pairs of drive electrodes 228 and there may be any suitable number of secondary drive electrodes in between primary drive electrodes.

Figure 3:
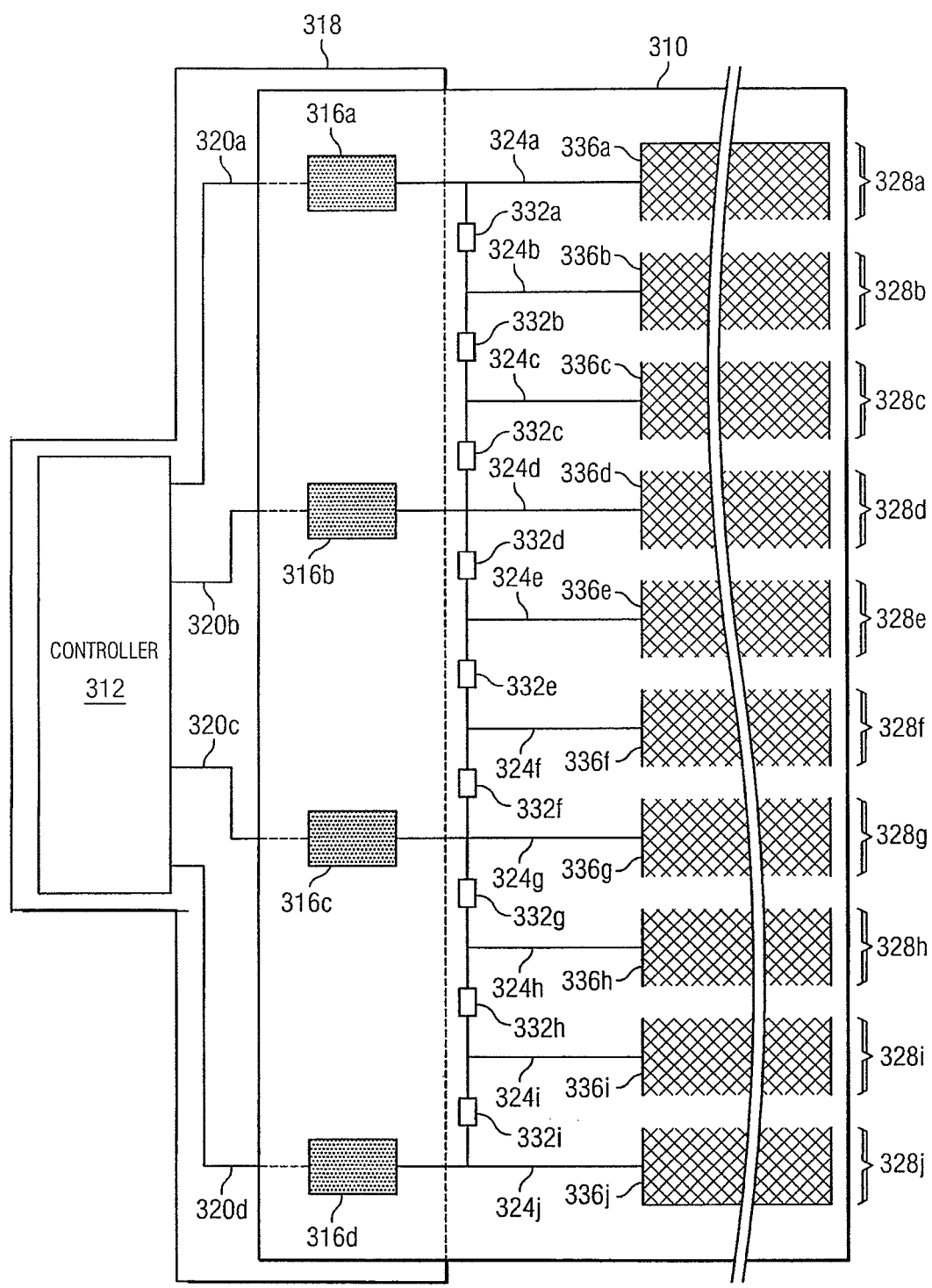
FIG. 3 illustrates an example touch sensor comprising drive electrodes formed of opaque conductive material and configured for resistive interpolation using resistors coupled between tracks of the touch sensor.

FIG. 3 illustrates an example touch sensor 310 comprising drive electrodes 328 formed of opaque conductive material and configured for resistive interpolation using resistors 332 coupled between tracks 324 of the touch sensor. The drive electrodes 328 of touch sensor 310 are coupled to controller 312 via connection pads 316, tracks 324, and connector 318. Touch sensor 310, controller 312, connection pads 316, tracks 324, and connector 318 may have any suitable characteristics described above with respect to touch sensor 10 or touch sensor 210, touch-sensor controller 12 or touch-sensor controller 212, connection pads 16 or connection pads 216, tracks 14 or tracks 224, and connector 18 or connection 218 respectively.

The resistive interpolation implemented by touch sensor 310 and controller 312 may be similar to the resistive interpolation described above with respect to touch sensor 210 and controller 212. In the embodiment depicted in FIG. 3, the primary drive electrodes are the drive electrodes that are driven directly by controller 312, rather than through one or more of the resistors 332. For example, drive electrodes 328*a*, 328*d*, 328*g*, and 328*j* are each primary drive electrodes. The secondary drive electrodes are driven by controller 312 through one or more resistors 332 and thus will be driven with drive signals that have lower amplitudes than the drive signals received at the primary drive electrodes. In the embodiment depicted, the secondary drive electrodes are drive electrodes 328*b*, 328*c*, 238*e*, 328*f*, 328*h*, and 328*i*. The methods described above for driving the drive electrodes 328 and measuring the results based on resistive interpolation may be implemented by controller 312 and touch sensor 310.

Resistors 332 may have any suitable characteristics described above with respect to resistors 232. For example, resistors 332 may comprise the same material as drive electrodes 328 or any other conductive material capable of providing resistance to a electrical signal traveling through resistors 332. As another example, resistors 332 may have any suitable geometry, such as a meandering pattern. As depicted, resistors 332 are coupled between tracks 324. Resistors 332 may be coupled between any suitable portions of adjacent tracks, such as near connection pads 316, near the edge of drive electrodes 328, or anywhere in between.

In particular embodiments, resistors 332 are discrete resistors. A discrete resistor may include materials that are different from the materials used to create drive electrodes 328. For example, a discrete resistor may include one or more of carbon, ceramic, resin, metal, or other suitable resistive material. In particular embodiments, a discrete resistor has a lead on each end and the leads of the discrete resistor are connected to suitable portions of touch sensor 310. For example, each lead may be coupled to a track 324 or other conductive section of material electrically coupled to the appropriate drive electrode 328 (e.g., through track 324). A discrete resistor may be coupled to touch sensor 310 in any suitable manner, such as soldering or bonding.

Figure 4:
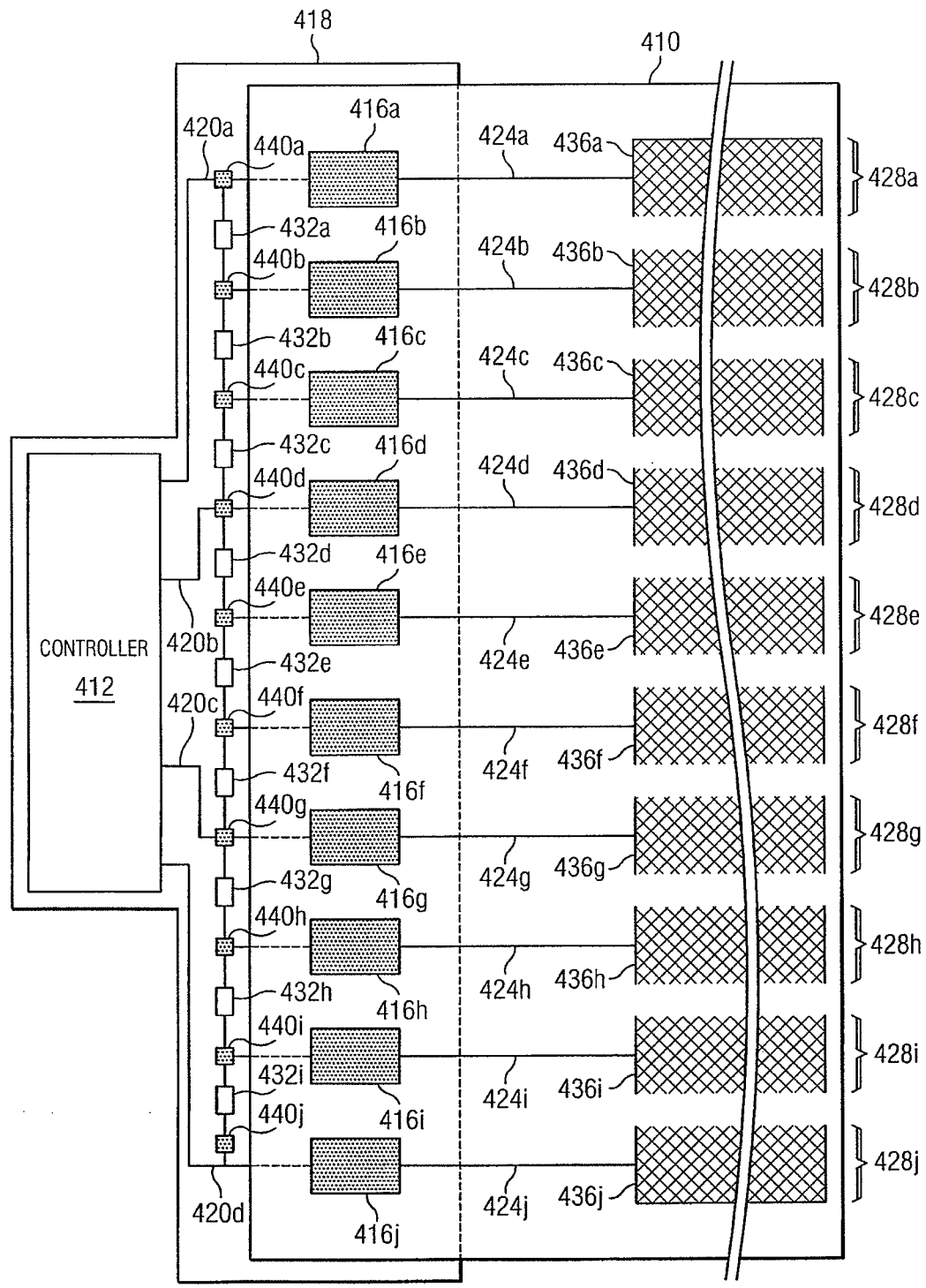
FIG. 4 illustrates an example touch sensor comprising drive electrodes formed of opaque conductive material and configured for resistive interpolation using resistors placed on a connector.

FIG. 4 illustrates an example touch sensor 410 comprising drive electrodes 428 formed of opaque conductive material and configured for resistive interpolation using resistors 432 placed on connector 418. The drive electrodes 428 of touch sensor 410 are coupled to controller 412 via connection pads 416, tracks 424, and connector 418. Touch sensor 410, controller 412, connection pads 416, tracks 424, and connector 418 may have any suitable characteristics described above with respect to touch sensors 10, 210, or 310, touch-sensor controllers 12, 212, or 312, connection pads 16, 216, or 316, tracks 14, 224, or 324, and connector 18, 218, or 318 respectively. In a particular embodiment, connector 418 includes an FPC.

The resistive interpolation implemented by touch sensor 410 and controller 412 may be similar to the resistive interpolation described above with respect to touch sensor 210 and controller 212. In the embodiment depicted in FIG. 4, the primary drive electrodes are the drive electrodes that are driven directly by controller 412, rather than through one or more of the resistors 432. For example, drive electrodes 428*a*, 428*d*, 428*g*, and 428*j* are each primary drive electrodes. The secondary drive electrodes are driven by controller 412 through one or more resistors 432 and thus will be driven with drive signals that have lower amplitudes than the drive signals received at the primary drive electrodes. In the embodiment depicted, the secondary drive electrodes are drive electrodes 428*b*, 428*c*, 438*e*, 428*f*, 428*h*, and 428*i*. The methods described above for driving the drive electrodes 428 and measuring the results based on resistive interpolation may be implemented by controller 412 and touch sensor 410.

Resistors 432 may have any suitable characteristics described above with respect to resistors 232 or 332. In particular embodiments, resistors 432 are discrete resistors. Resistors 432 may be placed at any suitable location of connector 418. For example, resistors 432 may be placed between conductive pads 440 formed on connector 418. Conductive pads may comprise any suitable conductive material in any suitable geometry. Resistors 432 may be coupled to conductive pads or other portions of connector 418 using any suitable method such as bonding or soldering. Each conductive pad 420 may be electrically coupled to conductive lines 420 (directly or through one or more resistors 440 and other conductive pads 420). In the embodiment depicted, each conductive pad 440 is placed in between two segments of a respective conductive line 420. As another example, resistors 432 may be coupled to connection pads of controller 418 that interface with connection pads 416 of touch sensor 410 (e.g., the resistors 432 may be placed on the side of the connection pads that is opposite to the side that interfaces with connection pads 416).

Particular embodiments of the present disclosure may provide one or more or none of the following technical advantages. In particular embodiments, resistive interpolation for a touch sensor with opaque conductive material may be provided. A technical advantage of one embodiment includes enabling a controller having a particular number of pins providing drive signals to control a touch sensor that has a particular number of drive electrodes, where the number of drive electrodes is greater than the number of pins of the controller. Another technical advantage of one embodiment may include reducing the amount of connection pads and the amount of tracking required to couple connection pads of the touch sensor to the drive electrodes of the touch sensor. Certain embodiments of the present disclosure may include none, some, or all of the above technical advantages. One or more other technical advantages may be readily apparent to one skilled in the art in view of the figures, descriptions, and claims of the present disclosure.

Herein, reference to memory or a computer-readable non-transitory storage medium or media may include one or more semiconductor-based or other integrated circuits (ICs) (such, as for example, a field-programmable gate array (FPGA) or an application-specific IC (ASIC)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards, SECURE DIGITAL drives, any other suitable computer-readable non-transitory storage medium or media, or any suitable combination of two or more of these, where appropriate. A memory or computer-readable non-transitory storage medium or media may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. For example, the figures depicted herein are not necessarily drawn to scale and any suitable dimensions may be used for any of the components of the figures. Moreover, although this disclosure describes and illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A device comprising:
    a touch sensor comprising:
        a substrate;
        a plurality of drive electrodes disposed on the substrate, each of the plurality of drive electrodes formed of an opaque conductive material; and
        a plurality of resistors, each of the opaque conductive material, wherein for each adjacent pair of drive electrodes of the plurality of drive electrodes, a resistor of the plurality of resistors is electrically coupled to the pair of drive electrodes between the pair of drive electrodes;
    a controller operable to supply drive signals to at least a subset of the plurality of drive electrodes;
    a flexible printed circuit that couples the controller to at least a subset of the plurality of drive electrodes, wherein each of the plurality of resistors are disposed on the flexible printed circuit; and
    a cover panel overlaying at least a portion of the touch sensor.

2. The device of claim 1, wherein each of the plurality of drive electrodes comprises a mesh pattern.

3. The device of claim 1, wherein the controller comprises a plurality of pins, each pin of the plurality of pins connected to a distinct drive electrode of the plurality of drive electrodes, the controller operable to send a drive signal through one of the plurality of pins to a drive electrode of the plurality of drive electrodes while grounding each other drive electrode of the plurality of drive electrodes that is connected to a different pin of the controller.

4. An apparatus comprising:
    a substrate;
    a plurality of drive electrodes disposed on the substrate, each of the plurality of drive electrodes formed of an opaque conductive material;
    a plurality of resistors, wherein for each adjacent pair of drive electrodes of the plurality of drive electrodes, a resistor of the plurality of resistors is electrically coupled to the pair of drive electrodes between the pair of drive electrodes;
    a controller operable to supply drive signals to at least a subset of the plurality of drive electrodes; and
    a flexible printed circuit that couples the controller to at least a subset of the plurality of drive electrodes; and
    wherein each of the plurality of resistors are disposed on the flexible printed circuit.

5. The apparatus of claim 4, wherein the plurality of resistors are formed on the substrate of the same opaque conductive material that forms the plurality of drive electrodes.

6. The apparatus of claim 4, wherein each resistor of at least a subset of the plurality of resistors comprises:
   a repeating rectangular pattern; or
   a sinusoidal pattern.

7. The apparatus of claim 4, wherein a resistor of the plurality of resistors connects an edge of a drive electrode of the plurality of drive electrodes to an edge of another drive electrode of the plurality of drive electrodes.

8. The apparatus of claim 4, wherein each of the plurality of drive electrodes comprises a mesh pattern.

9. The apparatus of claim 4, further comprising a plurality of conductive tracks coupled to the plurality of drive electrodes, and wherein each of the plurality of resistors is connected between two conductive tracks of the plurality of conductive tracks.

10. The apparatus of claim 9, wherein at least a subset of the plurality of conductive tracks are configured to be coupled to a controller that supplies drive signals to at least a subset of the plurality of drive electrodes through the at least the subset of the plurality of conductive tracks.

11. The apparatus of claim 4, further comprising a controller having a plurality of pins, each pin of the plurality of pins connected to a distinct drive electrode of the plurality of drive electrodes, the controller operable to send a drive signal through one of the plurality of pins to a drive electrode of the plurality of drive electrodes while grounding each other drive electrode of the plurality of drive electrodes that is connected to a different pin of the controller.

12. The apparatus of claim 4, wherein the drive electrodes of the plurality of drive electrodes are drive electrodes of a self-capacitance touch sensor or a mutual-capacitance touch sensor.

13. A method comprising:
   providing a substrate;
   disposing a plurality of drive electrodes on the substrate, each of the plurality of drive electrodes formed of an opaque conductive material;
   coupling a plurality of resistors to the plurality of drive electrodes, wherein for each adjacent pair of drive electrodes of the plurality of drive electrodes, a resistor of the plurality of resistors is electrically coupled to the pair of drive electrodes between the pair of drive electrodes;
   supplying, by a controller, drive signals to at least a subset of the plurality of drive electrodes; and
   coupling, by a flexible printed circuit, the controller to at least a subset of the plurality of drive electrodes, wherein each of the plurality of resistors are disposed on the flexible printed circuit.

14. The method of claim 13, wherein coupling the plurality of resistors to the plurality of drive electrodes comprises forming the plurality of resistors of the opaque conductive material.

15. The method of claim 13, wherein each resistor of at least a subset of the plurality of resistors comprises a:
   repeating rectangular pattern; or
   a sinusoidal pattern.

16. The method of claim 13, wherein a resistor of the plurality of resistors connects an edge of a drive electrode of the plurality of drive electrodes to an edge of another drive electrode of the plurality of drive electrodes.

17. The method of claim 13, wherein each of the plurality of drive electrodes comprises a mesh pattern.

18. The method of claim 13, further comprising forming a plurality of conductive tracks coupled to the plurality of drive electrodes, and wherein coupling the plurality of resistors to the plurality of drive electrodes comprises connecting each of the plurality of resistors between two conductive tracks of the plurality of conductive tracks.

19. The method of claim 18, wherein at least a subset of the plurality of conductive tracks are configured to be coupled to a controller that supplies drive signals to at least a subset of the plurality of drive electrodes through the at least the subset of the plurality of conductive tracks.

* * * * *